(12) United States Patent
Chiang et al.

(10) Patent No.: US 7,372,691 B2
(45) Date of Patent: May 13, 2008

(54) APPARATUS AND METHOD FOR JOINING TWO SUBSTRATES

(75) Inventors: Ching Wei Chiang, Miao-Li (TW); Yen Chung Chang, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 352 days.

(21) Appl. No.: 11/151,871

(22) Filed: Jun. 13, 2005

(65) Prior Publication Data

US 2005/0275999 A1    Dec. 15, 2005

(30) Foreign Application Priority Data

Jun. 11, 2004    (CN) ............... 2004 1 0027661

(51) Int. Cl.
*H01L 21/683* (2006.01)
(52) U.S. Cl. .................................................. 361/234
(58) Field of Classification Search ................ 361/234
See application file for complete search history.

(56) References Cited

U.S. PATENT DOCUMENTS 6,466,426 B1 * 10/2002 Mok et al. ................ 361/234
6,496,350 B2 * 12/2002 Fujiwara ................... 361/234
6,773,762 B1 * 8/2004 Fukiage ..................... 427/534

FOREIGN PATENT DOCUMENTS

TW    526367    4/2003

* cited by examiner

*Primary Examiner*—Michael Sherry
*Assistant Examiner*—Christopher J Clark
(74) *Attorney, Agent, or Firm*—Wei Te Chung

(57) ABSTRACT

A substrate attaching device (3) includes a vacuum chamber (31), a first electrostatic chuck (32) at least partly set in the vacuum chamber, and further includes a chuck body (321) with a plurality of gas releasing holes (322), a working table (33) stationable below the first electrostatic chuck in the vacuum chamber, a gas supply (34) communicating with the gas releasing holes, a pump device (35) communicating with the vacuum chamber, and a sub-vacuum (37) chamber communicating with both the vacuum chamber and the pump device.

8 Claims, 3 Drawing Sheets

APPARATUS AND METHOD FOR JOINING TWO SUBSTRATES

BACKGROUND OF THE INVENTION

1. Field of the Invention

The present invention relates to a substrate attaching device and a substrate attaching method, and especially to a device typically used for combining two substrates such as those that form a framework of a liquid crystal display (LCD) cell.

2. General Background

An LCD cell generally comprises two glass substrates, a peripheral sealant, and a plurality of liquid crystal molecules retained in a space defined between the substrates and the sealant. The sealant is first printed on one of the glass substrates, and is then adhered to the other glass substrate. The substrates and the sealant cooperatively form the space therebetween, and then the liquid crystal molecules are filled into the space.

There are generally two methods used for filling the liquid crystal molecules into the space. The first method is to fill the liquid crystal molecules through filling ports. This method comprises the following steps: firstly, printing a sealant on a first glass substrate, wherein the sealant is rectangular and has one or more gaps that function as filling ports; secondly, combining a second glass substrate with the first glass substrate and curing the sealant, wherein a space is enclosed by the sealant and the two glass substrates; thirdly, immersing the filling ports in a liquid crystal material in a vacuum chamber; and finally, introducing gas into the vacuum chamber to make the liquid crystal molecules fill up the space.

The second method is the so-called one-drop-fill (ODF) method. This method comprises the following steps: firstly, printing a sealant on a first glass substrate, wherein the sealant is rectangular and continuous, and a space is enclosed by the sealant and the first glass substrate; secondly, putting liquid crystal molecules into the space drop by drop using a dispenser; and finally, combining a second glass substrate with the first glass substrate and curing the sealant. The ODF process also needs to be performed in a vacuum, at least at the time when the substrates are combined. Thus, in both the first and second methods, a substrate attaching device that can provide a vacuum is necessary.

A typical substrate attaching device utilizes an electrostatic chuck (ESC) and a working table. A first substrate is attached to the ESC by way of electrostatic attraction produced by a voltage applied on the ESC. A second substrate is placed on the working table. The ESC and the working table are moved toward each other until the first substrate is attached to the second substrate. Then the applied voltage is stopped, so that the ESC no longer attracts the first substrate. However, electrostatic charges tend to accumulate on the ESC, and these charges do not immediately dissipate when the applied voltage is stopped. That is, the electrostatic attraction between the first substrate and the ESC does not immediately cease, and it may be difficult to disengage the first substrate from the ESC.

Referring to FIG. 4, this shows another typical substrate attaching device 1. The substrate attaching device 1 comprises a vacuum chamber 11, a first ESC 12, a working table 13, a gas supply 14, a vacuum pump 15, and a controller 16. The first ESC 12 is set substantially in the vacuum chamber 11, and the working table 13 can be set in the vacuum chamber 11. The first ESC 12 comprises a chuck body 121 with a plurality of gas releasing holes 122. The gas releasing holes 122 communicate with a gas pipe 141, so that nitrogen gas can be transferred from the gas supply 14 to a bottom surface of the chuck body 121. A valve 142 is set along the gas pipe 141, to open and close and thereby regulate the flow of nitrogen gas. The vacuum chamber 11 is connected with the vacuum pump 15 through a gas pipe 151. A valve 152 is set along the gas pipe 151, to open and close and thereby regulate the flow of gases. The controller 16 controls the gas supply 14 and the vacuum pump 15 to operate at different times, to feed nitrogen gas and evacuate the inside of the vacuum chamber 11 alternately.

In operation, a substrate attaching method using the substrate attaching device 1 comprises the following steps. Firstly, a second substrate 23 is placed on a working table 13. A sealant 231 is printed on the second substrate 23, and liquid crystal material 232 material is dropped onto the second substrate 23 in a space defined by the sealant 231. Secondly, a first substrate 22 is attached to the chuck body 121 by electrostatic attraction. Thirdly, the first substrate 22 and the second substrate 23 are aligned with each other, and the vacuum pump 15 is operated by the controller 16 to evacuate the vacuum chamber 11. The first ESC 12 is lowered toward the working table 13, so that the first substrate 22 is attached onto the second substrate 23. Finally, referring to FIG. 5, the vacuum pump 15 is stopped by the controller 16. Nitrogen gas is and supplied to the bottom surface of the chuck body 121 by the gas supply 14 under the control of the controller 16. The flowing nitrogen gas can help separate the first substrate 22 from the chuck body 121, so that the combined first and second substrates 22, 23 can be moved out from the vacuum chamber 11.

However, when the gas supply 14 supplies nitrogen gas to the chuck body 121, the vacuum pump of the vacuum chamber 11 stops operating. Thus, a pressure in an inside space of the combined substrates 22, 23 is lower than a pressure in the vacuum chamber 11. Under such conditions, the nitrogen gas may penetrate into the inside space of the combined substrates 22, 23. Bubbles of nitrogen gas may form in the liquid crystal material 232. These can result in impaired performance or even failure of the LCD cell.

What is needed, therefore, is a substrate attaching device that can improve a manufacturing yield of LCD cells. What is also needed is a substrate attaching method that can improve a manufacturing yield of LCD cells.

SUMMARY

In one preferred embodiment, a substrate attaching device comprises a vacuum chamber, a first electrostatic chuck at least partly set in the vacuum chamber, and comprises a chuck body with a plurality of gas releasing holes, a working table stationable below the first electrostatic chuck in the vacuum chamber, a gas supply communicating with the gas releasing holes, a pump device communicating with the vacuum chamber, and a sub-vacuum chamber communicating with both the vacuum chamber and the pump device.

In another preferred embodiment, a method for reliably attaching two substrates together comprises: providing a substrate attaching device comprising a vacuum chamber, a first electrostatic chuck at least partly set in the vacuum chamber, a working table stationable below the first electrostatic chuck in the vacuum chamber, and a sub-vacuum chamber connected with the vacuum chamber; holding a first one of the substrates to the first electrostatic chuck, and disposing a second one of the substrates on the working table; moving the first electrostatic chuck and the working table closer together until the first substrate and the second substrate are attached together; and supplying a gas to the first electrostatic chuck in order to separate the first substrate from the first electrostatic chuck, while simultaneously maintaining a degree of vacuum in the sub-vacuum chamber higher than a degree of vacuum in the vacuum chamber.

The nitrogen gas cannot penetrate into the space inside the combined substrates, accordingly, the yield of LCD cells comprising the combined substrates is improved.

Other advantages and novel features will become more apparent from the following detailed description of preferred embodiments when taken in conjunction with the accompanying drawings, in which:

DETAILED DESCRIPTION OF PREFERRED EMBODIMENTS

Reference will now be made to the drawings to describe the preferred embodiments in detail.

Figure 1:
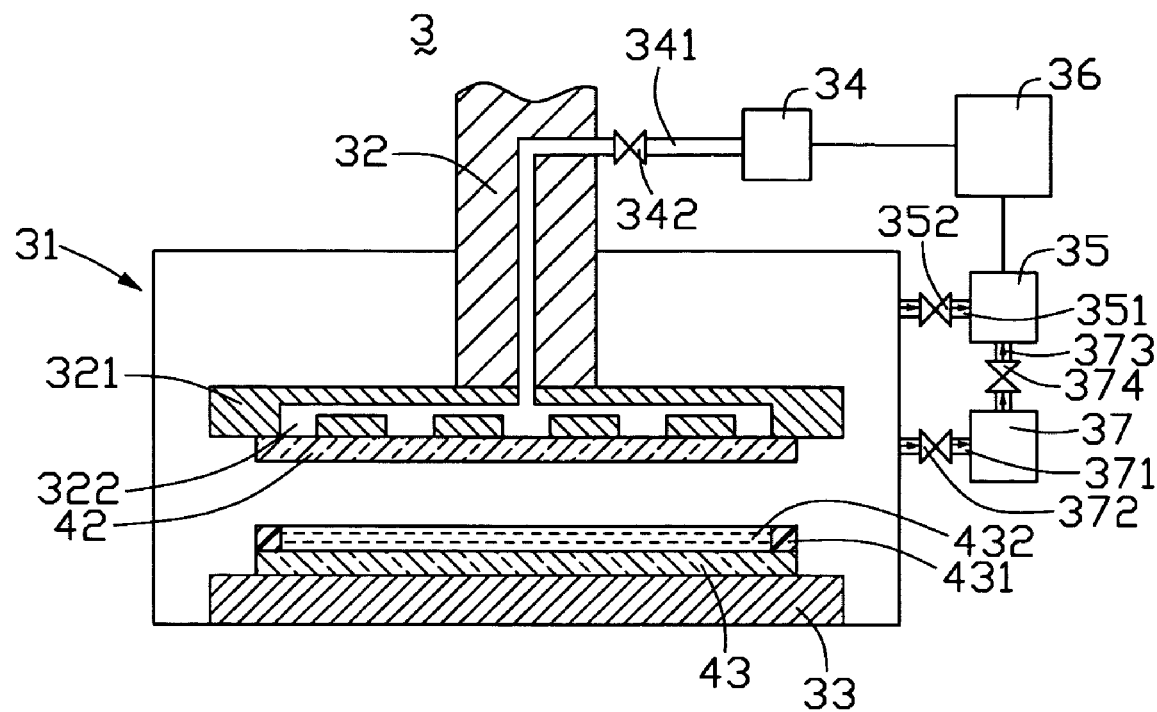
FIG. 1 is a schematic, side cross-sectional view of a substrate attaching device according to a preferred embodiment of the present invention, together with a pair of substrates inside a vacuum chamber of the substrate attaching device.

Referring to FIG. 1, a substrate attaching device 3 in accordance with the preferred embodiment comprises a vacuum chamber 31, a first ESC 32, a working table 33, a gas supply 34, a vacuum pump 35, a controller 36, and a sub-vacuum chamber 37. The controller 36 controls the gas supply 34 and the vacuum pump 35 to operate at different times alternately.

The vacuum chamber 31 is connected with the vacuum pump 35, which is used to evacuate an inside of the vacuum chamber 31 to a pressure of about 0.1 torr. Thus, the vacuum chamber 31 can provide a vacuum condition. The vacuum pump 35 communicates with the vacuum chamber 31 through a second gas pipe 351, wherein the second gas pipe 351 comprises a valve 352 for regulation the gas flow of the second gas pipe 351 by opening or closing.

The first ESC 32 is set substantially in the vacuum chamber 31, and comprises a chuck body 321 with a plurality of gas releasing holes 322. The chuck body 321 can attract a first substrate 42 by electrostatic attraction. The first ESC 32 can be raised or lowered relative to the working table 33. The working table 33 is used to place a second substrate 43 thereon. After the second substrate 43 is placed on the working table 33, the working table 33 is moved in the vacuum chamber 31 until is directly under the first ESC 32. That is, the working table 33 can be moved into and out from the vacuum chamber 31.

The gas releasing holes 322 communicate with a first gas pipe 341, so that nitrogen gas can be transferred from the gas supply 34 to a bottom surface of the chuck body 321. The first gas pipe 341 comprises a valve 342, which can be opened or closed to regulate the flow of gas through the first gas pipe 341.

The sub-vacuum chamber 37 communicates with the vacuum chamber 31 through a third gas pipe 371, and also communicates with the vacuum pump 35 through a fourth gas pipe 373. The third gas pipe 371 and the fourth gas pipe 373 respectively comprise a valve 372 and a valve 374, for regulation of the flow of gas through the third gas pipe 371 and the fourth gas pipe 373 respectively.

Figure 2:
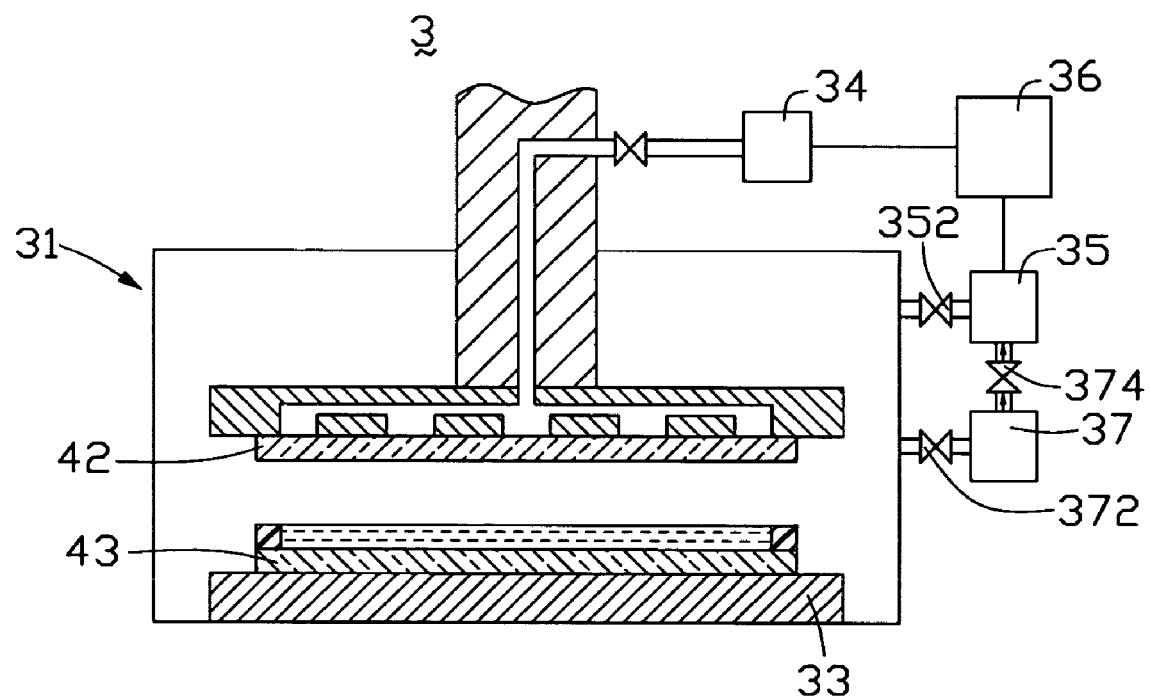
FIG. 2 is similar to FIG. 1, but showing gas flow during a step in a method for attaching the two substrates together according to a preferred embodiment of the present invention.
Figure 3:
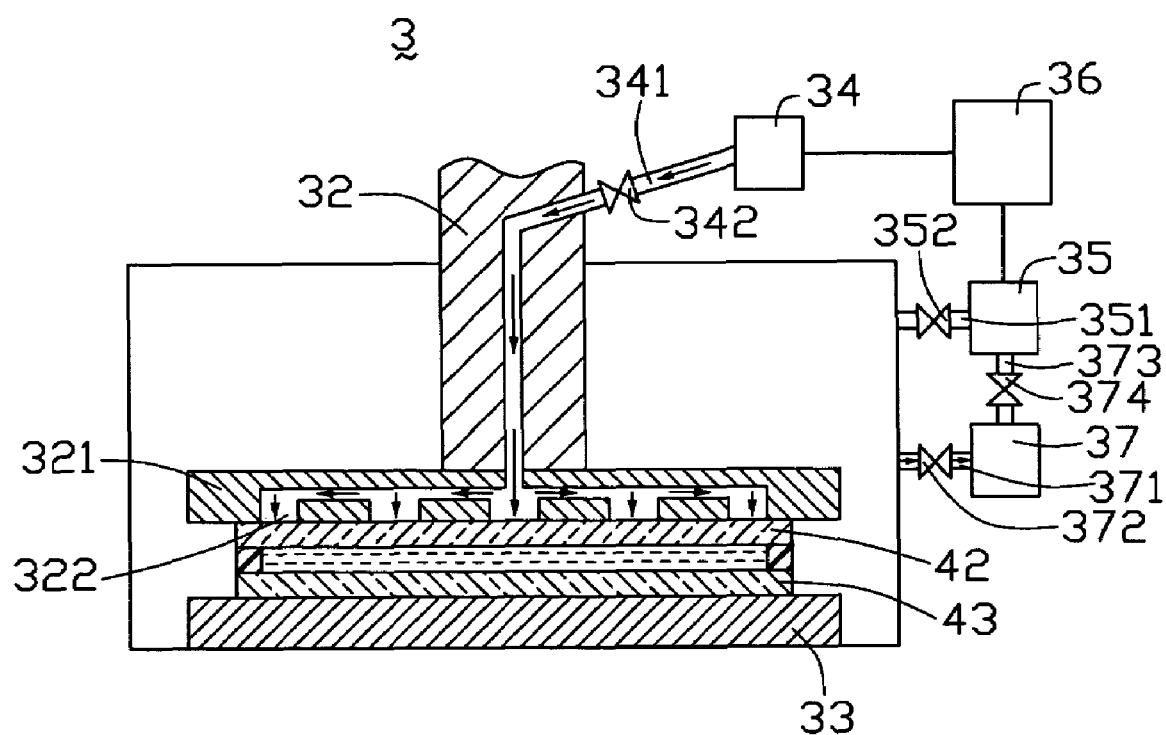
FIG. 3 is similar to FIG. 2, but showing a subsequent step in the method for attaching the two substrates together, including gas flow during such subsequent step.
Figure 4:
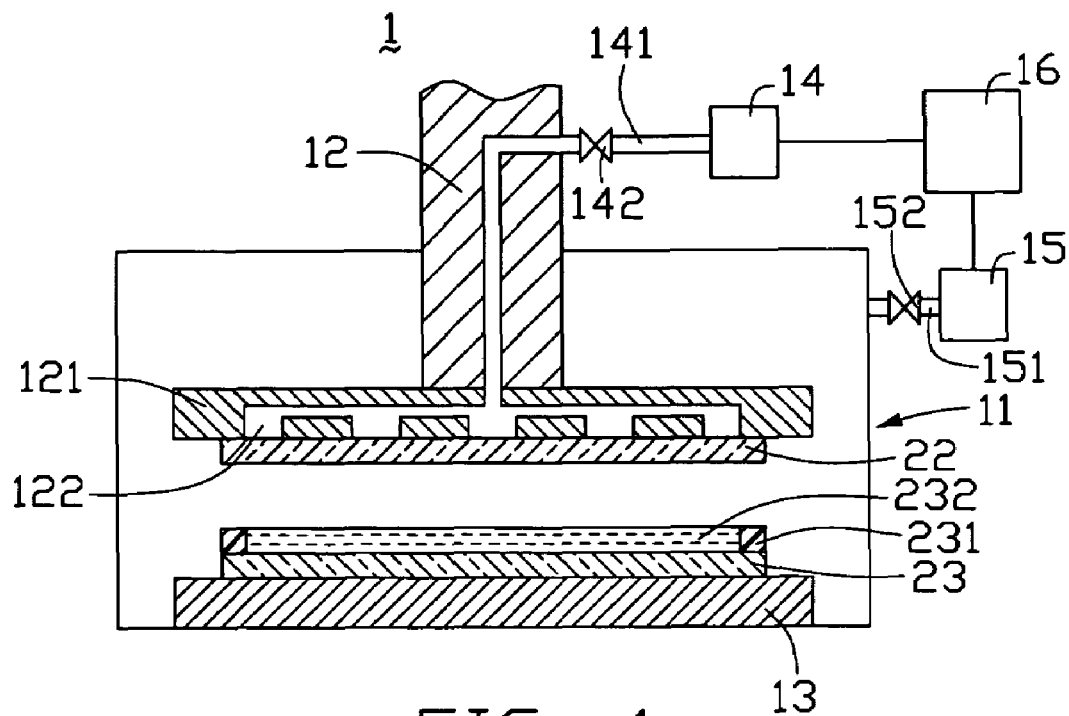
FIG. 4 is a schematic, side cross-sectional view of a typical substrate attaching device, together with a pair of substrates inside a vacuum chamber of the substrate attaching device.
Figure 5:
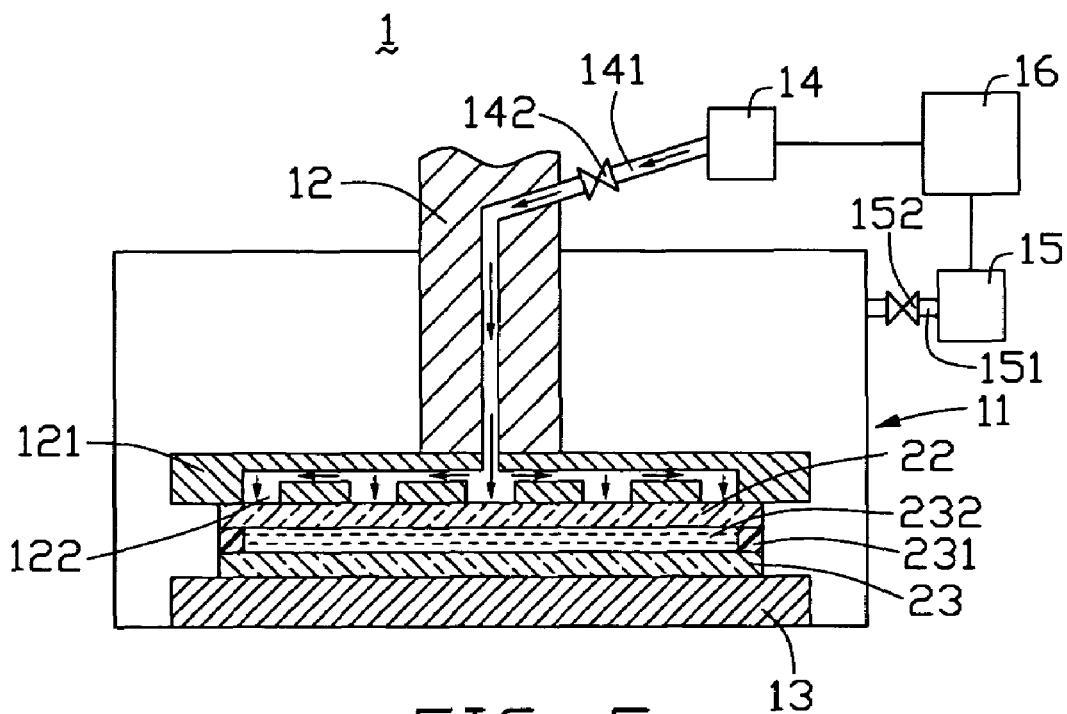
FIG. 5 is a similar to FIG. 4, but showing a step in a method for attaching the two substrates together by using the substrate attaching device.

Referring to FIG. 2 and FIG. 3, in operation, a substrate attaching method using the substrate attaching device 3 comprises the following steps. Firstly, the first substrate 42 is held by the electrostatic chuck body 321, and the working table 33 is moved out of the vacuum chamber 31. Secondly, the second substrate 43 is placed on the working table 33. A sealant 431 is printed on the second substrate 43. Liquid crystal molecules 432 are dispensed into a space enclosed by the sealant 431 and the second substrate 43, drop by drop using a dispenser (not shown). Thirdly, the working table 33 is moved into the vacuum chamber 31, and the working table 33 is aligned with the electrostatic chuck body 321. Fourthly, the valve 342 is closed, and the valves 352, 372 and 374 are opened. The controller 36 controls the vacuum pump 35 to evacuate gas from inside the vacuum chamber 31, with a direction of gas flow as shown in FIG. 2. Fifthly, the valves 352 and 372 are closed, and the valve 374 is opened. The vacuum pump 35 continues to evacuate gas from inside the sub-vacuum chamber 37, in order to make the degree of vacuum of the sub-vacuum chamber 37 higher than the degree of vacuum of the vacuum chamber 31. Sixthly, referring to FIG. 3, the first ESC 32 is moved toward the working table 33, so that the first substrate 42 and the second substrate 43 are attached to each other. Finally, the controller 36 is stopped. The valve 342 is opened, so that nitrogen gas is supplied from the gas supply 34 to the first substrate 42. The nitrogen gas may be supplied at a constant flow rate, or at a varying flow rate such as in pulses. The nitrogen gas facilitates separation of the first substrate 42 from the chuck body 321. Thus the combined first and second substrates 42, 43 supported on the working table 33 can be readily moved out from the vacuum chamber 31.

The gas supply 34 feeds nitrogen gas under pressure to the first substrate 42 in the vacuum chamber 31, with the valves 352 and 374 being closed and the valve 372 being open. Because the degree of vacuum of the sub-vacuum chamber 37 is higher than the degree of vacuum of the vacuum chamber 31, the nitrogen gas subsequently flows into the sub-vacuum chamber 37 without affecting the degree of vacuum of the vacuum chamber 31. Thus, the pressure in the space inside the combined substrates 42, 43 is equal to the pressure in the vacuum chamber 31. Under such conditions, the nitrogen gas cannot penetrate into the space inside the combined substrates 42, 43. Accordingly, the yield of LCD cells comprising the combined substrates 42, 43 is improved.

In alternative embodiments, the working table 33 can also be a chuck body, so as to attract the second substrate 43 by electrostatic attraction. Any of the first, second, third, and fourth gas pipes 341, 351, 371, 373 can be gas pipelines or piping systems suitable for particular applications.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A method for reliably attaching two substrates together, comprising:
   providing a substrate attaching device comprising a vacuum chamber, a first electrostatic chuck at least partly set in the vacuum chamber, a working table stationable below the first electrostatic chuck in the vacuum chamber, and a sub-vacuum chamber connected with the vacuum chamber;
   holding a first one of the substrates to the first electrostatic chuck, and disposing a second one of the substrates on the working table;
   moving the first electrostatic chuck and the working table closer together until the first substrate and the second substrate are attached together; and
   supplying a gas to the first electrostatic chuck in order to separate the first substrate from the first electrostatic chuck, while simultaneously maintaining a degree of vacuum in the sub-vacuum chamber higher than a degree of vacuum in the vacuum chamber.

2. The method as claimed in claim 1, wherein the gas comprises nitrogen gas.

3. The method as claimed in claim 1, wherein the working table comprises an electrostatic chuck comprising a chuck body.

4. The method as claimed in claim 1, wherein the first electrostatic chuck comprises a chuck body with a plurality of gas releasing holes.

5. The method as claimed in claim 4, wherein the gas is supplied by a gas supply, which communicates with the gas releasing holes of the chuck body.

6. The method as claimed in claim 5, wherein the substrate attaching device further comprises a vacuum pump connected with both the vacuum chamber and the sub-vacuum chamber, and the gas supply and the vacuum pump operate at different times alternately.

7. The method as claimed in claim 1, further comprising the steps of: printing a sealant on the second substrate; and dispensing liquid crystal material into a space enclosed by the sealant and the second substrate.

8. The method as claimed in claim 1, wherein the gas is supplied to the first electrostatic chuck in pulses.

* * * * *